(12) United States Patent
Bandic et al.

(10) Patent No.: US 7,986,484 B2
(45) Date of Patent: Jul. 26, 2011

(54) METHOD AND SYSTEM FOR FABRICATING A DATA STORAGE MEDIUM

(75) Inventors: Zvonimir Z. Bandic, San Jose, CA (US); Michael A. Moser, San Jose, CA (US)

(73) Assignee: Hitachi Global Storage Technologies, Netherlands B.V., Amsterdam (NL)

( * ) Notice: Subject to any disclaimer, the term of this patent is extended or adjusted under 35 U.S.C. 154(b) by 845 days.

(21) Appl. No.: 11/998,715

(22) Filed: Nov. 30, 2007

(65) Prior Publication Data

US 2009/0140175 A1    Jun. 4, 2009

(51) Int. Cl.
*G11B 21/02* (2006.01)
*G08B 13/14* (2006.01)

(52) U.S. Cl. .............. 360/75; 360/98.01; 360/264.1; 360/78.04; 340/572.1

(58) Field of Classification Search .......... 250/491.1; 361/234; 340/572.1; 360/98.01, 75, 264.1, 360/78.04
See application file for complete search history.

(56) References Cited

U.S. PATENT DOCUMENTS

| | | | | |
|---|---|---|---|---|
| 5,049,739 A * | 9/1991 | Okamoto | | 250/281 |
| 5,381,008 A * | 1/1995 | Tanner et al. | | 250/288 |
| 5,752,309 A * | 5/1998 | Partee et al. | | 29/603.18 |
| 6,157,030 A * | 12/2000 | Sakairi et al. | | 250/292 |
| 6,265,717 B1 * | 7/2001 | Sakata et al. | | 250/289 |
| 7,119,330 B2 * | 10/2006 | Kalinitchenko | | 250/288 |
| 7,199,361 B2 * | 4/2007 | Bloomfield et al. | | 250/282 |
| 7,202,470 B1 * | 4/2007 | Marriott | | 250/281 |
| 7,230,232 B2 * | 6/2007 | Marriott | | 250/281 |
| 7,329,863 B2 * | 2/2008 | Kalinitchenko | | 250/288 |
| 7,339,163 B2 * | 3/2008 | Marriott | | 250/281 |
| 2004/0056189 A1 * | 3/2004 | Tanner et al. | | 250/287 |
| 2005/0269506 A1 * | 12/2005 | Kalinitchenko | | 250/288 |
| 2006/0151690 A1 * | 7/2006 | Marriott | | 250/288 |
| 2009/0266984 A1 * | 10/2009 | Hirano | | 250/288 |

* cited by examiner

*Primary Examiner* — Nikita Wells
*Assistant Examiner* — Johnnie L Smith

(57) ABSTRACT

Embodiments of the present invention recite a method and system for fabricating a data storage medium. In one embodiment, a detectable pattern is created at the surface of a substrate. An electron beam lithography process is then initiated upon the substrate. The detectable pattern is used to control the positioning of an electron beam relative to the surface of the substrate during the electron beam lithography process.

24 Claims, 14 Drawing Sheets

METHOD AND SYSTEM FOR FABRICATING A DATA STORAGE MEDIUM

TECHNICAL FIELD

Embodiments of the present invention are generally related to the field of data storage devices.

BACKGROUND ART

Future data storage devices such as optical data storage media and magnetic data storage media are expected to continue to utilize greater data densities. As a result, electron beam (e-beam) lithography is increasingly used in the fabrication of optical and magnetic data storage media.

As an example, optical data storage devices use a master disk from which the optical data disks are replicated. In one manufacturing method, a substrate is placed in an e-beam lithography apparatus and patterned to create a relief pattern in the substrate. A daughter disk is created from the master disk by electroplating a metal layer upon the master disk to capture a negative image the relief pattern formed on the master disk. The metal layer is then removed and the actual optical data storage disks are made by melting or pressing polycarbonate pellets to replicate the relief pattern of the master disk. Thus, one master disk can be used to create many daughter disks which are in turn used to create many optical data storage disks.

In the past, e-beam, or laser beam, lithography utilized precision mechanical positioning to position a substrate beneath an electron beam column 110 which focuses and aligns the electron beam used to pattern a substrate. As the need for greater precision became apparent, in order to support greater data density on the substrate, laser interferometers were used to more precisely position the substrate beneath the electron beam column.

FIG. 1 shows a conventional e-beam lithography apparatus 100. In FIG. 1, a substrate 101 is disposed upon a stage 105. Stage 105 is rotated by a spindle 106 which is in turn mounted on a linear actuator 107. A mirror 108 is used to detect the positioning of linear actuator 107 using a laser interferometer 120. As a result, the position of stage 105 and substrate 101 can also be determined precisely. In a rotary stage e-beam lithography apparatus, spindle 106 comprises a mirrored surface which is used to detect the positioning of spindle 106 using one or more laser interferometers 130. Thus, mirror 108 can determine the position of linear actuator 107 in an X plane of movement while one or more other mirrors (not shown) can determine the position of linear actuator 107 in Y and Z planes of movement. Additionally, laser interferometer 120 can detect wobble of spindle 106 around its axis of rotation. Thus, the positioning of stage 105 can be determined very precisely and used to control the positioning of substrate 101 with respect to electron beam column 110. However, due to the trend toward increased data density used in data storage devices, conventional e-beam lithography positioning methods may not have sufficient precision to pattern data storage substrates. This transition when the e-beam lithographic tool may be insufficient occurs at track densities larger than 300 ktpi (thousands tracks per inch).

SUMMARY OF THE INVENTION

Embodiments of the present invention recite a method and system for fabricating a data storage medium. In one embodiment, a detectable pattern is created at the surface of a substrate. An electron beam lithography process is then initiated upon the substrate. The detectable pattern is used to control the positioning of an electron beam relative to the surface of the substrate during the electron beam lithography process

BRIEF DESCRIPTION OF THE DRAWINGS

The accompanying drawings, which are incorporated in and form a part of this specification, illustrate embodiments of the presented technology and, together with the description, serve to explain the principles of the presented technology. Unless specifically noted, the drawings referred to in this description should be understood as not being drawn to scale.

DETAILED DESCRIPTION

Reference will now be made in detail to the alternative embodiments of the present technology. While some of the present technology will be described in conjunction with the alternative embodiments, it will be understood that they are not intended to limit the present technology to these embodiments. On the contrary, embodiments of the present technology are intended to cover alternatives, modifications and equivalents, which may be included within the spirit and scope of the embodiments as defined by the appended claims.

Furthermore, in the following detailed description, numerous specific details are set forth in order to provide a thorough understanding of embodiments of the present technology. However, it will be recognized by one of ordinary skill in the art that embodiments may be practiced without these specific details. In other instances, well known methods, procedures, components, and circuits have not been described in detail as not to unnecessarily obscure aspects of embodiments of the present technology.

Figure 1:
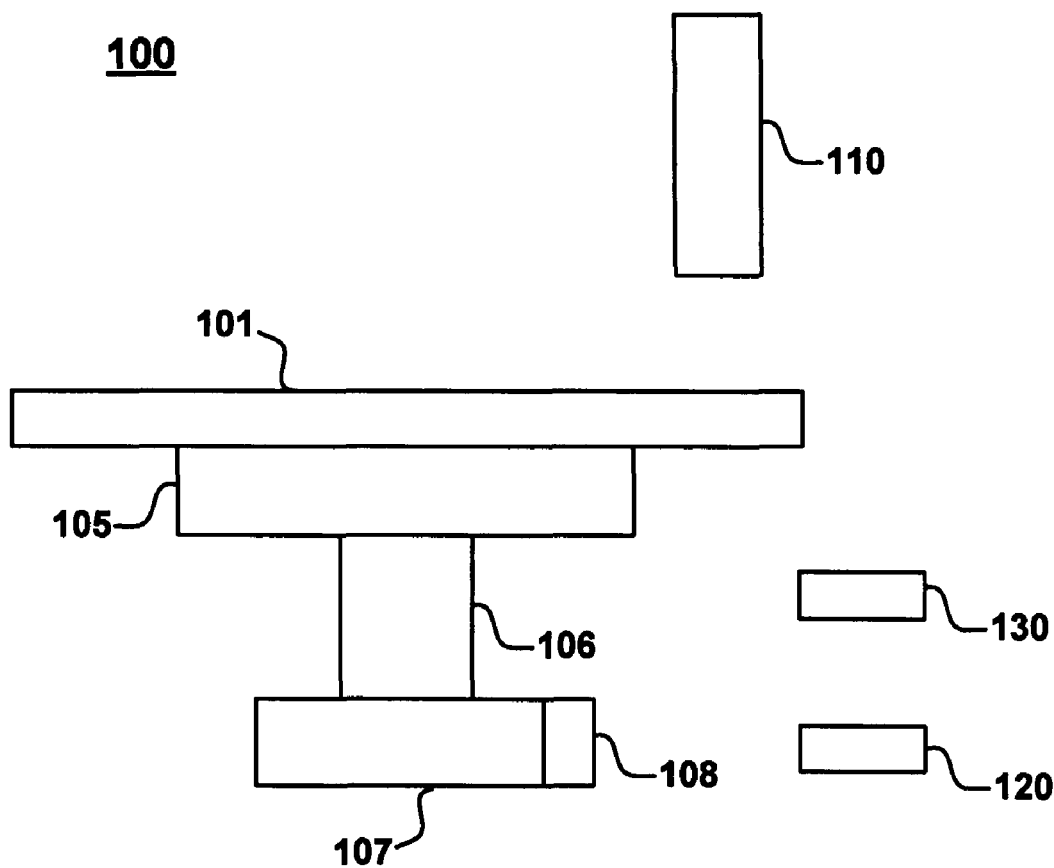
FIG. 1 is a diagram of a conventional electron beam lithography apparatus.
Figure 2:
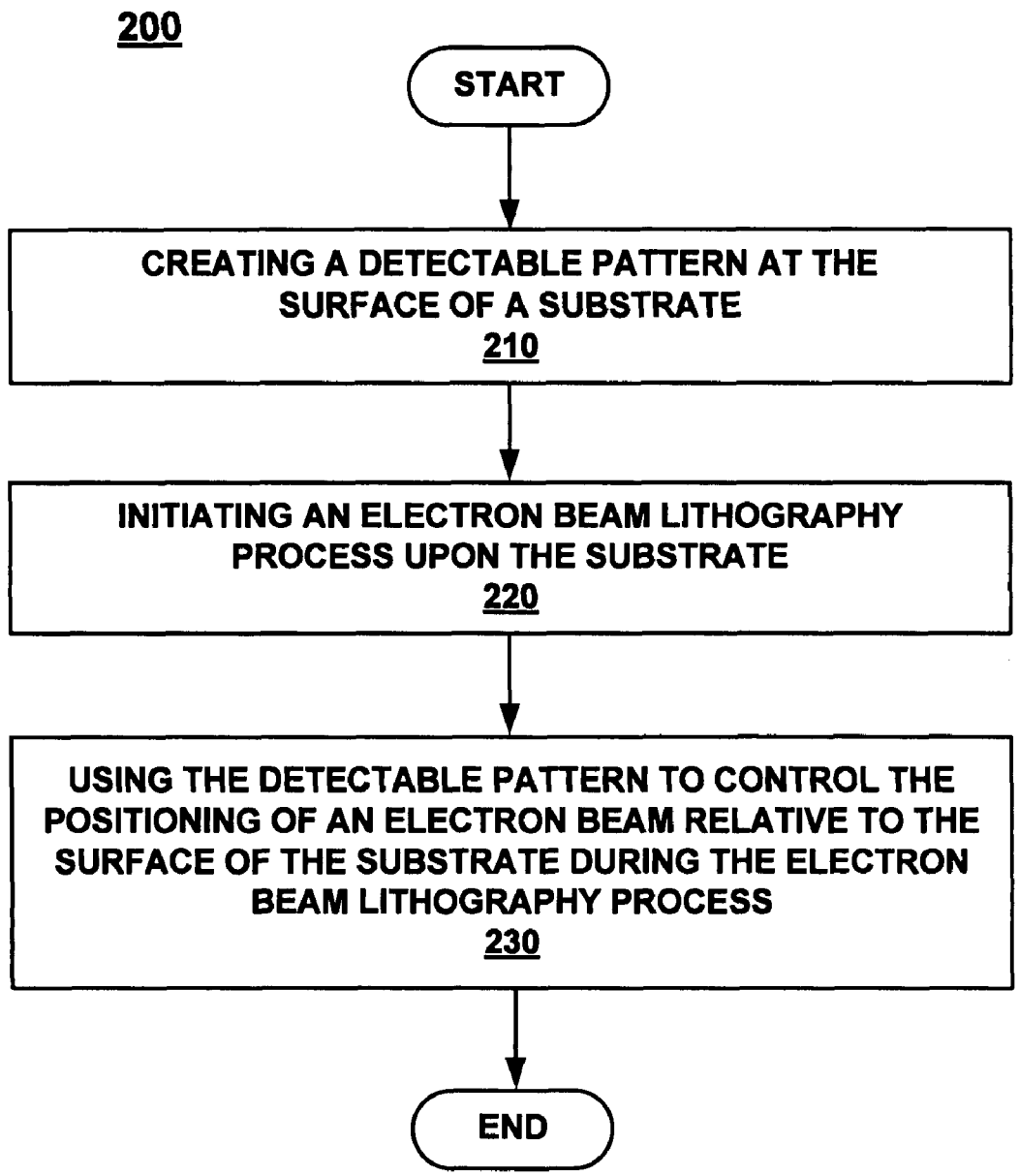
FIG. 2 is a flowchart of a method for fabricating a data storage medium in accordance with one embodiment of the present invention.

FIG. 2 is a flowchart of a method 200 for fabricating a data storage medium in accordance with one embodiment of the present invention. In operation 210 of FIG. 2, a detectable pattern is created at the surface of a substrate. In one embodiment of the present invention, prior to creating a relief pattern on the surface of the substrate, a high precision optical lithography process is used to create the detectable pattern at the surface of the substrate.

Alternatively, the detectable pattern may be created using the e-beam lithographic tool prior to creating the relief pattern. For example, the detectable pattern may be created using the e-beam lithography tool in a more precise "slow" patterning mode. Typically, the detectable pattern only covers approximately 5% of the surface area of the substrate. Thus, using the e-beam tool to create the detectable pattern in the slow mode is not unacceptably slow. In contrast, creating the relief pattern over the remaining portion of the substrate using the slow mode may be too lengthy of a process. Thus, for creating the relief pattern, the less precise fast patterning mode used in the e-beam lithography process.

In one embodiment, this optical lithography process results in the selective deposition of metal on the surface of the substrate to create a "metallized" pattern on the surface of the substrate. Alternatively, the optical lithography process may result in etching a pattern into the substrate itself. The pattern created at the surface of the substrate is then used to derive a position error signal which is used to control the positioning of the substrate later in the fabrication of the relief pattern upon the substrate. The position error signal facilitates creating the relief pattern upon the surface of the substrate in the fast patterning mode of the e-beam lithography process without losing fidelity.

Figure 3:
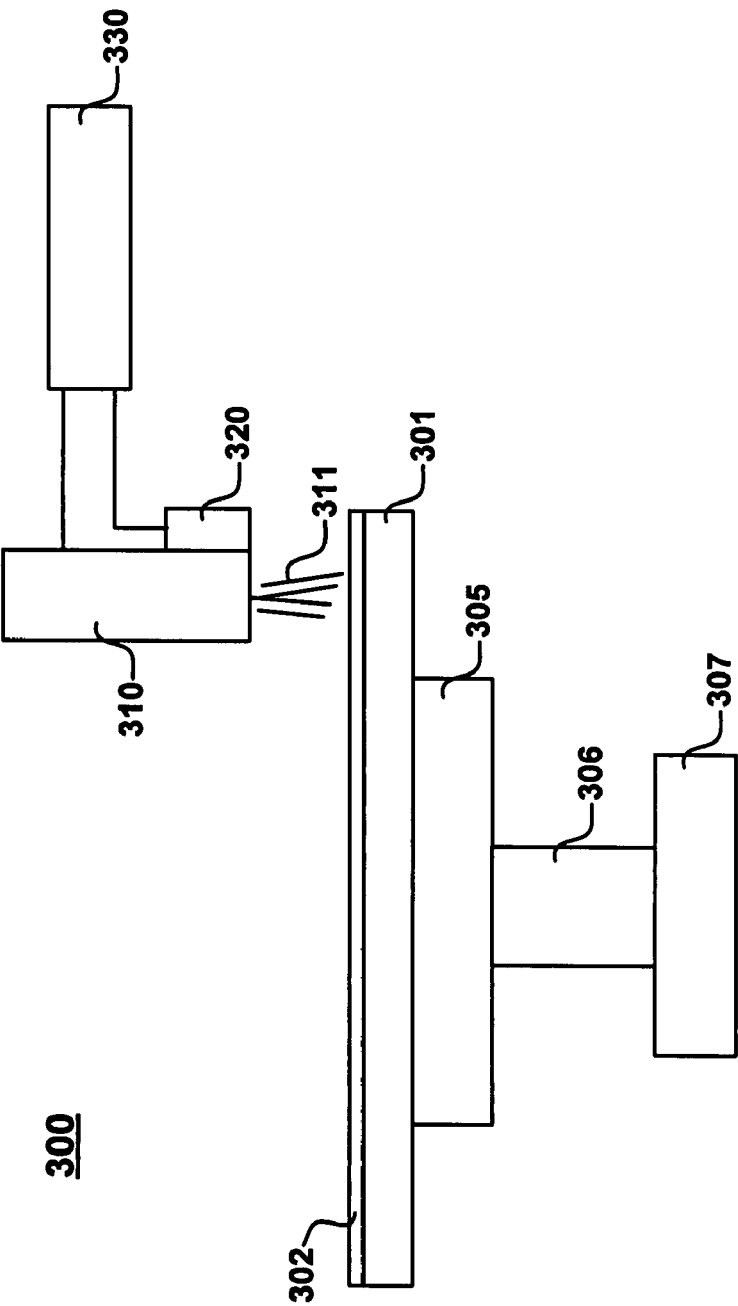
FIG. 3 is a diagram of an electron beam lithography apparatus in accordance with one embodiment of the present invention.
Figure 4A:
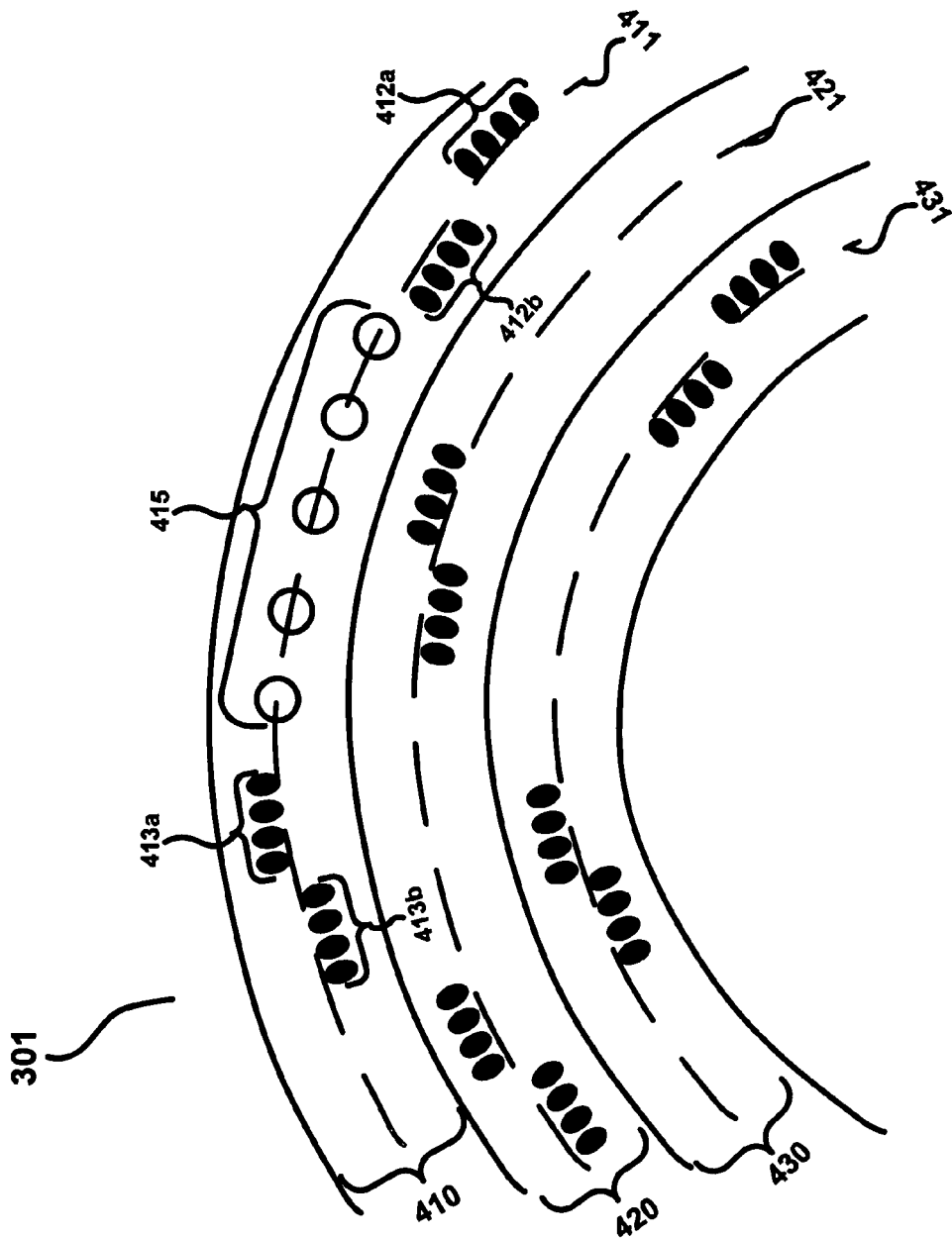
FIGS. 4A and 4B are top views of data storage media fabricated in accordance with embodiments of the present invention.

FIG. 4A is a top view of a data storage medium fabricated in accordance with embodiments of the present invention. In FIG. 4A, a plurality of data tracks 410, 420 and 430 are shown disposed upon a substrate (e.g., 301 of FIG. 3). Each of data tracks 410, 420, and 430 has a respective track centerline (e.g., 411, 421, and 431 respectively). In one embodiment, substrate 301 is an optical data storage master disk. Alternatively, substrate 301 may comprise a magnetic data storage disk. In embodiments of the present invention, substrate 301 comprises a glass, silicon, silicon dioxide, or other substrate material known in the art.

In the embodiment of FIG. 4A, a plurality of features 415 are being created upon substrate 301. In one embodiment these features are first defined in a layer of e-beam resist overlying substrate 301. During the lithography process, the resist is exposed such that features 415 can be created on the surface of substrate 301. In one embodiment, features 415 define holes which will be etched into the surface of substrate 301 such as for an optical data storage master disk. In another embodiment, features 415 comprise raised areas which can be used to define data bits for a patterned-media magnetic data storage device.

Also shown in FIG. 4A are a plurality of marks 412a, 412b 413a, and 413b which are created proximate to track centerline 411 to create a detectable pattern at the surface of substrate 301. Tracks 420 and 430 are similarly patterned. In one embodiment, marks 412a, 412b 413a, and 413b comprise metallized marks which are disposed upon the surface of substrate 301. An optical lithography process is used to selectively deposit a metal layer upon the surface of substrate 301 in the regions of marks 412a, 412b 413a, and 413b. As will be described in greater detail below, the use of metallized marks upon substrate 301 is advantageous in that more electrons will be reflected back from metallized marks 412a, 412b 413a, and 413b than from substrate 301. Typically, metallized marks 412a, 412b 413a, and 413b will reflect back a greater amount of electrons than substrate 301. This backscatter of electrons results in a signal which can be detected and used to determine the position of substrate 301. In other words, metallized marks 412a, 412b 413a, and 413b provide greater contrast with reference to electron backscatter which facilitates generating a detectable signal.

In another embodiment, substrate 301 is a metal substrate. In this instance, marks 412a, 412b 413a, and 413b are etched into the surface of substrate 301. This again increases the contrast of electron backscatter because substrate 301 will reflect back a greater amount of electrons than marks 412a, 412b 413a, and 413b in which some electrons will be reflected within the etched areas of marks 412a, 412b 413a, and 413b.

It is noted that the pattern of marks 412a, 412b 413a, and 413b shown in FIG. 4A is intended as one representation of a pattern created on substrate 301. It is further noted that there are a variety of patterns which can be used in accordance with embodiments of the present invention. Other patterns include, but are not limited to, a quadburst servo pattern, a phase servo pattern, a phase quadrature servo pattern, and other position error signal patterns. Additionally, marks 412a, 412b 413a, and 413b can be created as a sampled servo pattern, or a continuous servo pattern upon substrate 301 in embodiments of the present invention.

Figure 4B:
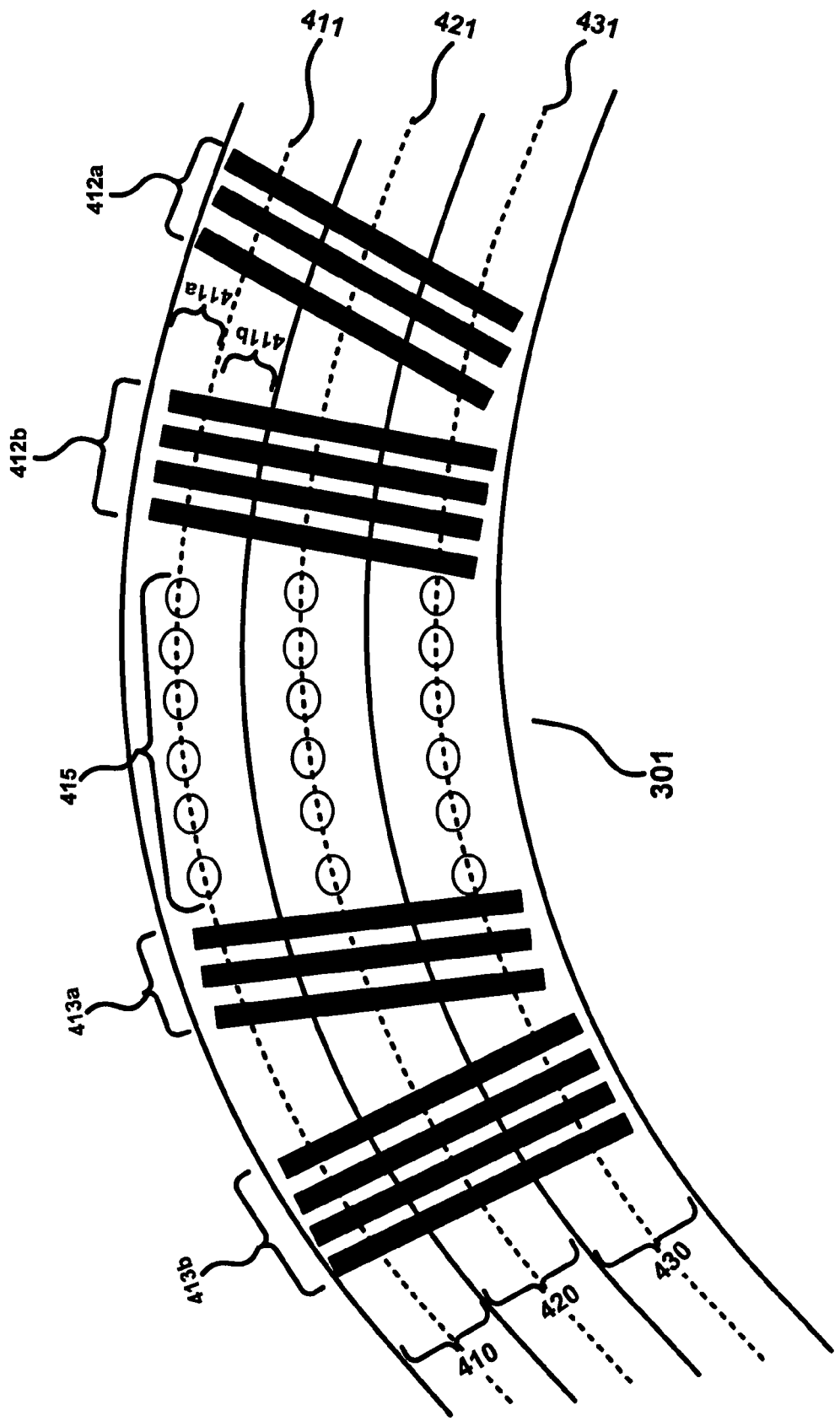

FIG. 4B shows an alternative pattern of marks 412a, 412b 413a, and 413b representing phase position patterning, that may also be used to detect fine position in accordance with embodiments of the present invention. The pattern shown in FIG. 4B is advantageous as it is suitable for pre-fabrication using optical lithography techniques.

In operation 220 of FIG. 2, an electron beam lithography process is initiated upon the substrate. As described above, positioning of the substrate in a conventional e-beam lithography process is controlled by detecting the position of the stage supporting the substrate being fabricated. In contrast, embodiments of the present invention detect the position of data tracks of the substrate itself. As a result, embodiments of the present invention provide a direct measurement of the position error at the surface of the substrate itself rather than measuring the position error of the stage or linear actuator supporting the substrate. More specifically, embodiments of the present invention directly measure the position error of the data track being created in real time. As a result, embodiments of the present invention provide greater precision in positioning features being created during the e-beam lithography process which facilitates greater data density upon the data storage media being fabricated.

In operation 230 of FIG. 2, the detectable pattern is used to control the positioning of an electron beam relative to the surface of the substrate during the electron beam lithography process. In one embodiment, the detectable pattern is monitored during the e-beam lithography process. In one embodiment, the detectable pattern comprises a servo control pattern which is detected by the e-beam lithography apparatus. The servo control pattern is used to derive a position error signal which is used in a servo control loop to control the positioning of an electron beam generated by the e-beam lithography apparatus. By measuring the position error at the substrate surface itself, embodiments of the present invention are able to more precisely determine errors in the positioning of the substrate with respect to the electron beam column which may not be detectable by a conventional e-beam lithography apparatus.

For example, while a conventional e-beam lithography apparatus can precisely determine the position of the stage with respect to the electron beam column, it cannot determine the relative position of the substrate surface relative to the electron beam column. For example, if the substrate is not precisely centered with respect to the axis of rotation of the stage, an eccentric motion of the substrate relative to the axis of rotation can be introduced when the substrate is rotated. As a result, the data tracks and/or formatting portions created on the substrate will be distorted due to repeatable and non-repeatable positioning errors. Similarly, if the substrate is not perfectly flat or level with the stage, an eccentric motion of the substrate surface will be introduced when the substrate is rotated. Additionally, thermal effects which occur during the e-beam lithography process can cause the substrate to expand and contract which moves the position of the tracks being created with reference to the axis of rotation. Unfortunately, most conventional e-beam lithography systems are not configured to detect, or correct, these types of positioning errors. As a result, they may not be capable of the level of precision needed future high density data storage media fabrication standards.

In contrast, embodiments of the present invention are well suited for detecting minute variations in the positioning of the substrate surface itself. Will be described in greater detail below, marks 412a, 412b 413a, and 413b generate a signal due to the electron backscatter present in e-beam lithography processes. This signal is used to derive a position error signal which provides track by track position information at the surface of substrate 301. As a result, the positioning of an electron beam (e.g., 311 of FIG. 3) from the electron beam column can be controlled more precisely to compensate for detected positioning errors of the substrate surface. As a result, embodiments of the present invention are well suited for fabricating higher density data storage media. Furthermore, embodiments of the present invention can be readily coupled with an existing e-beam lithography apparatus to improve the precision of the existing equipment. Thus, embodiments of the present invention facilitate upgrading legacy systems to a more precise level of performance in an economical manner.

FIG. 3 is a diagram of an electron beam lithography apparatus 300 in accordance with one embodiment of the present invention. In FIG. 3, a substrate 301 is placed upon a stage 305. Stage 306 is coupled with a coaxial spindle 306 which is in turn coupled with a linear actuator 307. In the embodiment of FIG. 3, apparatus 300 further comprises an electron beam column 310, an electron detector 320 which is coupled with a control device 330. In embodiments of the present invention, electron detector 320 comprises a backscatter detector, a secondary electron detector, or other device suitable for detecting the electrons reflected by marks 412a, 412b 413a, and 413b and/or substrate 301. In other words, electron beam detector 320 comprises a substrate surface pattern detector for detecting detectable pattern of marks 412a, 412b 413a, and 413b disposed upon substrate 301. In FIG. 3, control device 330 is communicatively coupled with electron beam column 310. It is noted that apparatus 300 may further comprise a mirror disposed upon linear actuator 307 which is used by a laser interferometer (not shown) which is used in determining the position of stage 305 in an X-axis plane of motion. Similarly, apparatus 300 may further comprise a laser interferometer (not shown) which detects wobble of spindle 306 if spindle 306 comprises a mirrored surface. This positioning data may also be used by control device 330 to control the positioning of an electron beam relative to the surface of substrate 301.

In operation, when a track is being patterned upon substrate 301, stage 305 is rotated and electron beam column 310 generates an electron beam 311 which is used to pattern a layer of e-beam lithography resist 302 disposed upon the surface of substrate 301. During the lithography process, some backscatter of electrons from electron beam 311 is detected by electron detector 320. More specifically, electrons will be reflected from the detectable pattern of marks 412a, 412b 413a, and 413b disposed upon substrate 301 prior to initiating the e-beam lithography process. As described above with reference to FIG. 4A, marks 412a, 412b, 413a, and 413b selectively increase/decrease the backscatter such that a signal is created by the backscatter of electrons during the e-beam lithography process.

In operation, electron detector 320 detects the backscatter of electrons from the surface of substrate 301 and marks 412a, 412b 413a, and 413b. For example, as substrate 301 is rotated during the e-beam lithography process, reflection of electrons by marks 412a, 412b 413a, and 413b will generate a signal at a frequency based upon the rotation speed of stage 305 and the number of marks 412a, 412b 413a, and 413b created on substrate 301. Electron detector 320 detects the signal caused by the backscatter of electrons by marks 412a, 412b 413a, and 413b and substrate 301. This signal is sent to control device 330 which derives a position error measurement of substrate 301 based upon this signal. In other words, electron beam column 310, electron detector 320 and control device 330 can be coupled in a closed loop servo control system. In the present embodiment, rather than controlling a voice coil magnet of a hard disk drive, the position error signal is used to control the positioning of electron beam 311.

More specifically, control device 330 detects variations in the positioning of tracks (e.g., tracks 410, 420, and 430 of FIG. 4A) relative to electron beam column 310 and/or electron beam 311. In one embodiment, control device 330 sends a position error signal to electron beam column 310 which is then used to control the X/Y axis positioning of electron beam 311 to compensate for variations in the position of the track being created. In another embodiment, electron beam column 310 may only be used to control the positioning of electron beam 311 in a single axis (e.g., the X axis only, or the Y axis only).

Figure 5A:
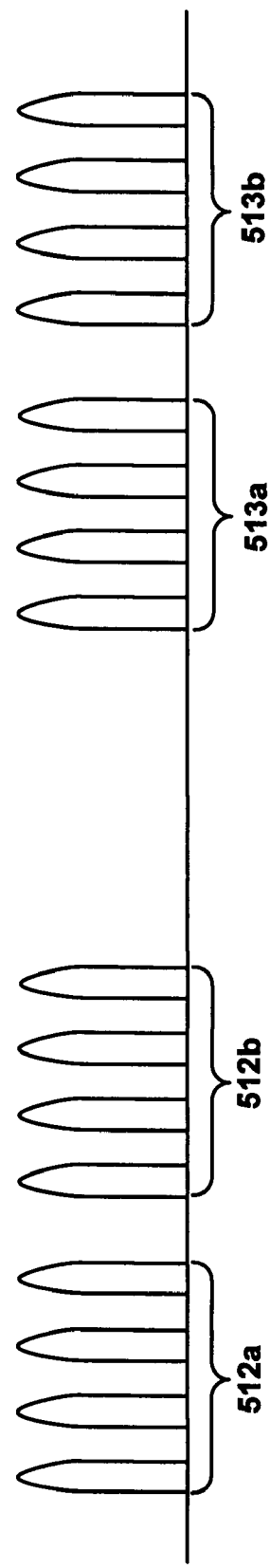
FIGS. 5A, 5B, 5C, 5D, 5E, and 5F show position signals caused by a pattern disposed at the surface of a substrate in accordance with embodiments of the present invention.
Figure 5B:
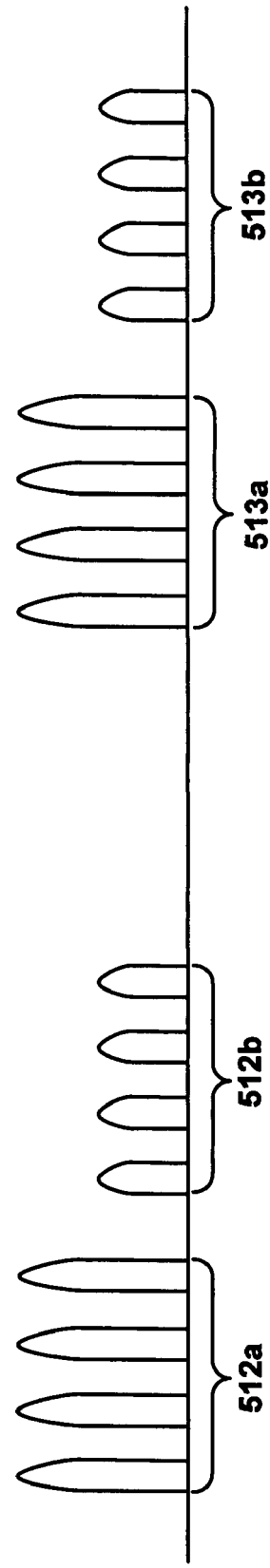
Figure 5C:
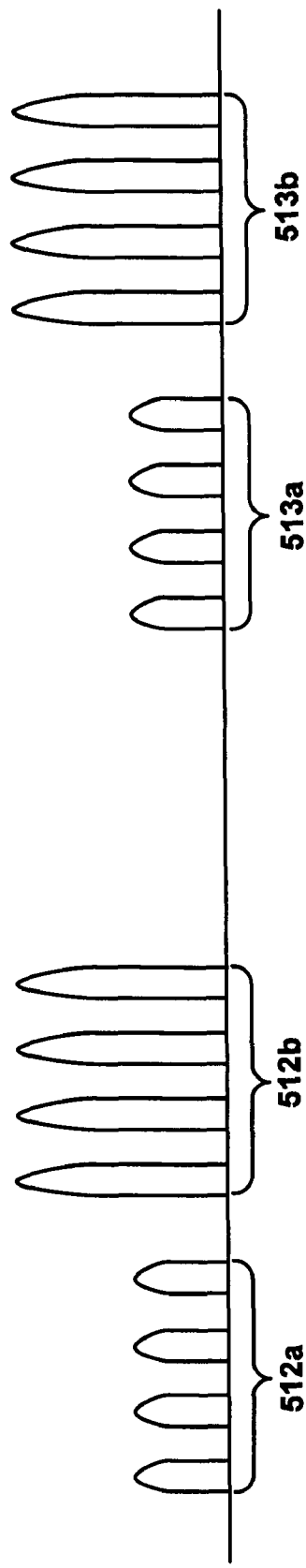

FIGS. 5A, 5B, and 5C show position signals caused by a pattern disposed at the surface of a substrate in accordance with embodiments of the present invention. During the e-beam lithography process, electron beam column 310 and electron detector 320 move along the tracks being created. With reference to FIG. 4B, when track 410 is being created, electron beam column 310 and electron detector 320 are typically centered above track centerline 411. This allows electron beam column 310 to pattern holes 315 into the e-beam resist disposed above substrate 310. FIG. 5A shows a signal received by electron detector 320 due to the backscattering of electrons when electron beam column 310 and electron detector 320 are properly centered above track centerline 411. In FIG. 5A, the signal peaks 512a are caused by the electron backscatter caused by marks 412a, while signal peaks 512b are caused by the electron backscatter caused by marks 412b. Similarly, peaks 513a are caused by the electron backscatter caused by marks 413a while the peaks 513b are caused by the electron backscatter caused by marks 413b. The signal peaks are due to the fact that metallized marks 412a, 412b 413a, and 413b reflect more electrons during the e-beam lithography process. As shown in FIG. 5A, when electron beam column 310 and electron detector 320 are properly centered above track centerline 411, the amplitude of signal peaks 512a are equal to the amplitude of signal peaks 512b. Similarly, the amplitude of signal peaks 513a are equal to the amplitude of signal peaks 513b.

In FIG. 5B, signal peaks 512a and 513a have a greater amplitude than signal peaks 512b and 513b. This indicates that electron beam column 310 and electron detector 320 are off center with respect to track centerline 411. Thus, with reference to FIG. 4B, FIG. 5B indicates that electron beam column 310 and electron detector 320 are centered more to the side on which metallized marks 412a and 413a are disposed and are thus receiving a stronger signal from those marks.

In FIG. 5C, signal peaks 512b and 513b have a greater amplitude than signal peaks 512a and 513a. This indicates that electron beam column 310 and electron detector 320 are again off center with respect to track centerline 411. Thus, with reference to FIG. 4B, FIG. 5C indicates that electron beam column 310 and electron detector 320 are centered more to the side on which metallized marks 412b and 413b are disposed and are thus receiving a stronger signal from those marks.

As shown in FIGS. 5A, 5B, and 5C, embodiments of the present invention can derive a position error signal from the pattern created at the surface of substrate 301 during an e-beam lithography process. This information can be used in a servo control loop to control the positioning of electron beam 311 to compensate for the detected positioning errors of substrate 301. More specifically, this can be performed on a track by track basis during the manufacture of an optical data master disk, or patterned magnetic data storage disk. As an example, signal peaks 512a may have a greater amplitude than signal peaks 512b while signals peaks 513a and 513b may have an equal amplitude. This indicates that electron beam column 310 and electron beam 320 are off center with respect to track centerline 411 when in the vicinity of marks 412a and 412b. This information can be used to control the positioning of electron beam 311 by electron beam column 310 to compensate for this positioning error. In another embodiment, electron detector 320, control device 330 and electron beam column 310 are coupled in a feed-forward system in order to compensate for positioning errors detected at the surface of substrate 301.

Figure 5D:
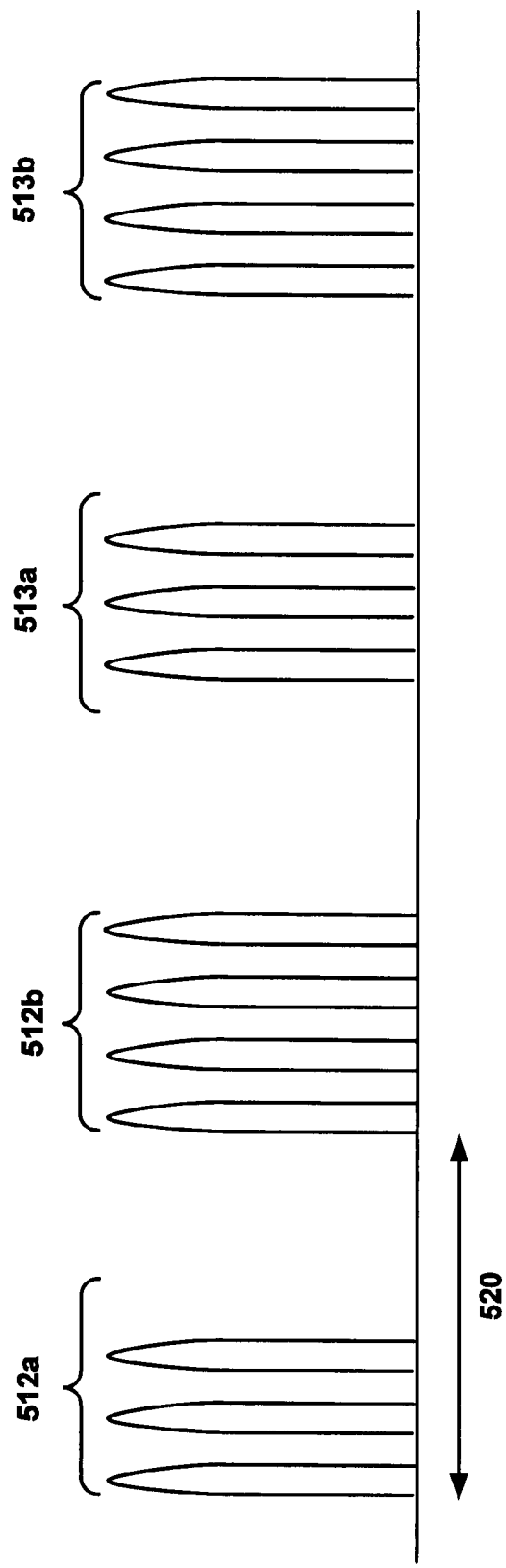
Figure 5E:
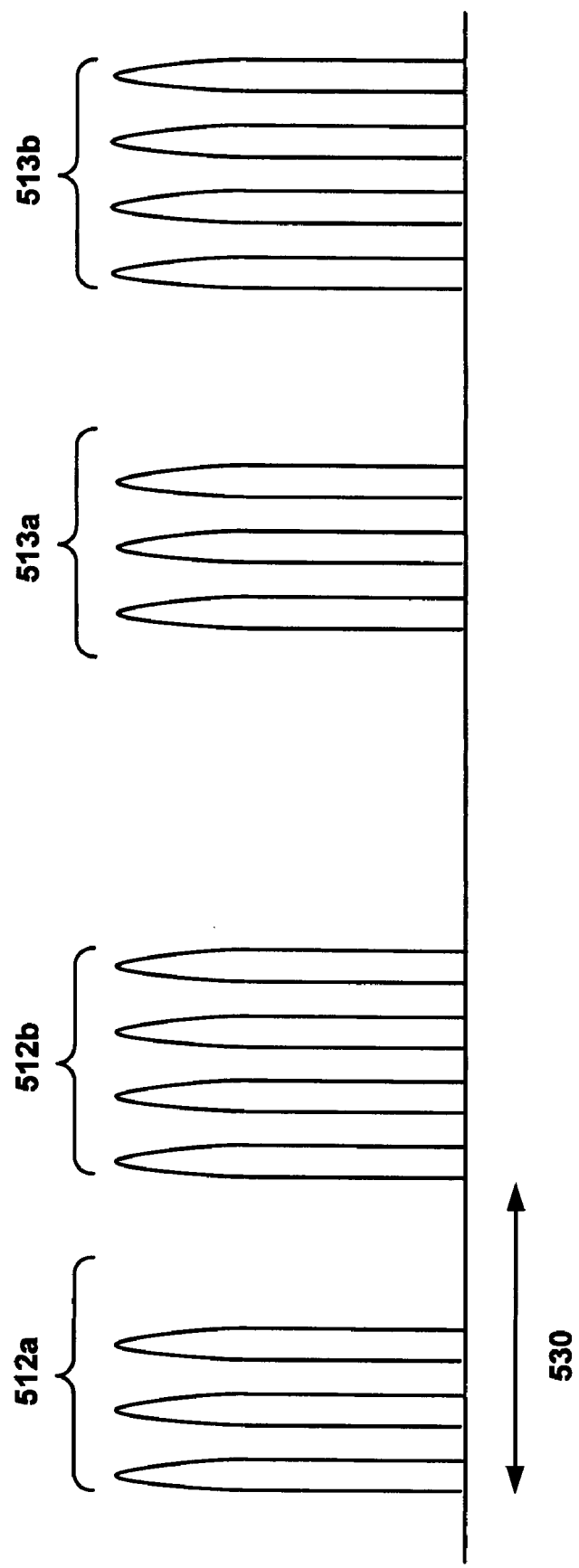
Figure 5F:
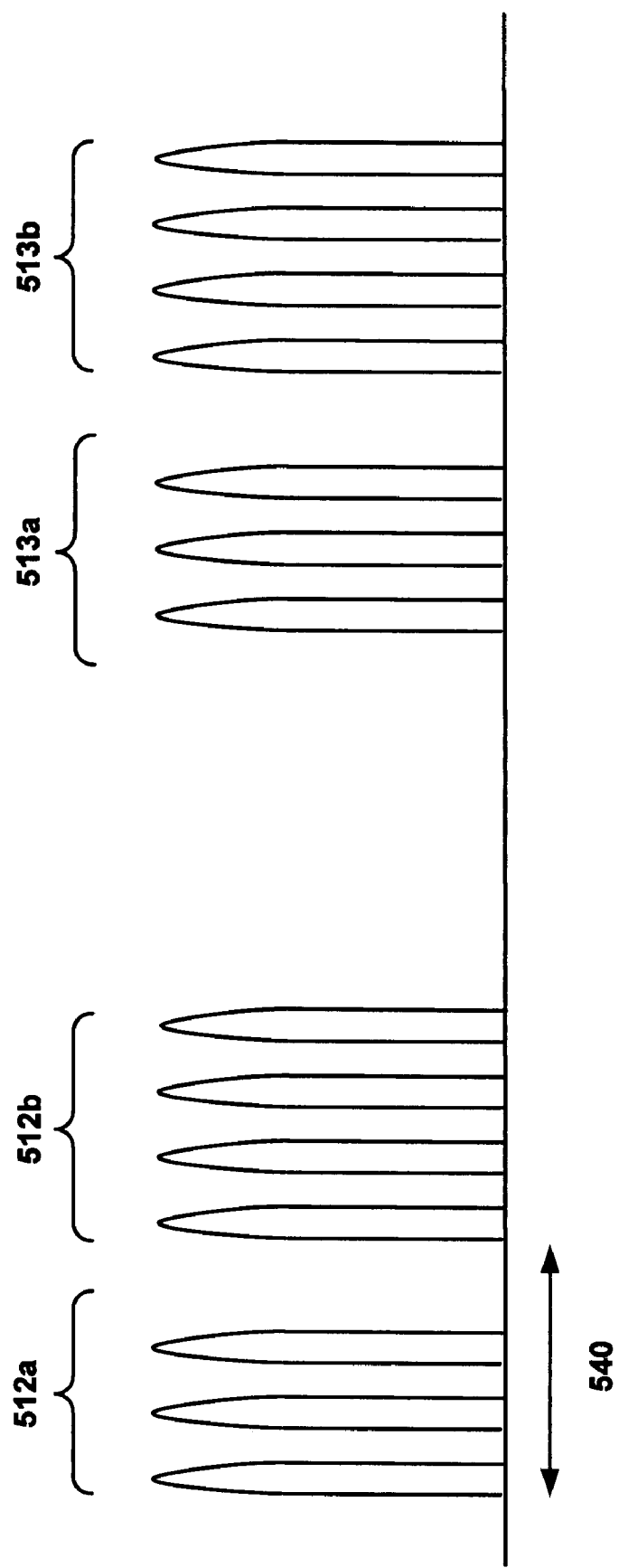

FIGS. 5D, 5E and 5F show the type of signal obtained from these patterns for the track patterning shown in FIG. 4B. Typically, the fine position is obtained by estimating phase difference between first and second group of pulses, or by measuring the time difference between the first and second group of pulses. Thus, with reference to FIG. 5E, the time difference 530 between the beginning of pulses 512a and 512b is representative of the signal pattern exhibited when electron beam column 310 and electron detector 320 are properly centered with respect to track centerline 411. It is noted that determining a positioning error of electron beam column 310 and electron detector 320 may be based upon the difference in the onset of signal pulses 512a and 512b, the difference in the average peak position of signal pulses 512a and 512b, or the like.

With reference to FIG. 5D, the time difference 520 between the beginning of pulses 512a and 512b are representative of the signal pattern exhibited when electron beam column 310 and electron detector 320 are improperly centered with respect to track centerline 411. More specifically, electron beam column 310 and electron detector 320 are disposed more to the side 411a of track 410. Due to the angle of marks 412a, when electron beam column 310 and electron detector 320 are to one side or the other of track centerline 411, the time difference (e.g., 520, 530, and 540 of FIGS. 5D-5F) between the beginning of pulses 512a and 512b will change as well. In FIG. 5D, time difference 520 is greater than time difference 530 of FIG. 5E which indicates a positioning error of electron beam column 310 and electron detector 320 with respect to track centerline 411.

Similarly, FIG. 5F the time difference 540 between the beginning of pulses 512a and 512b are representative of the signal pattern exhibited when electron beam column 310 and electron detector 320 are improperly centered with respect to track centerline 411. In the embodiment of FIG. 5F, electron beam column 310 and electron detector 320 are disposed more to side 411b.

Figure 6A:
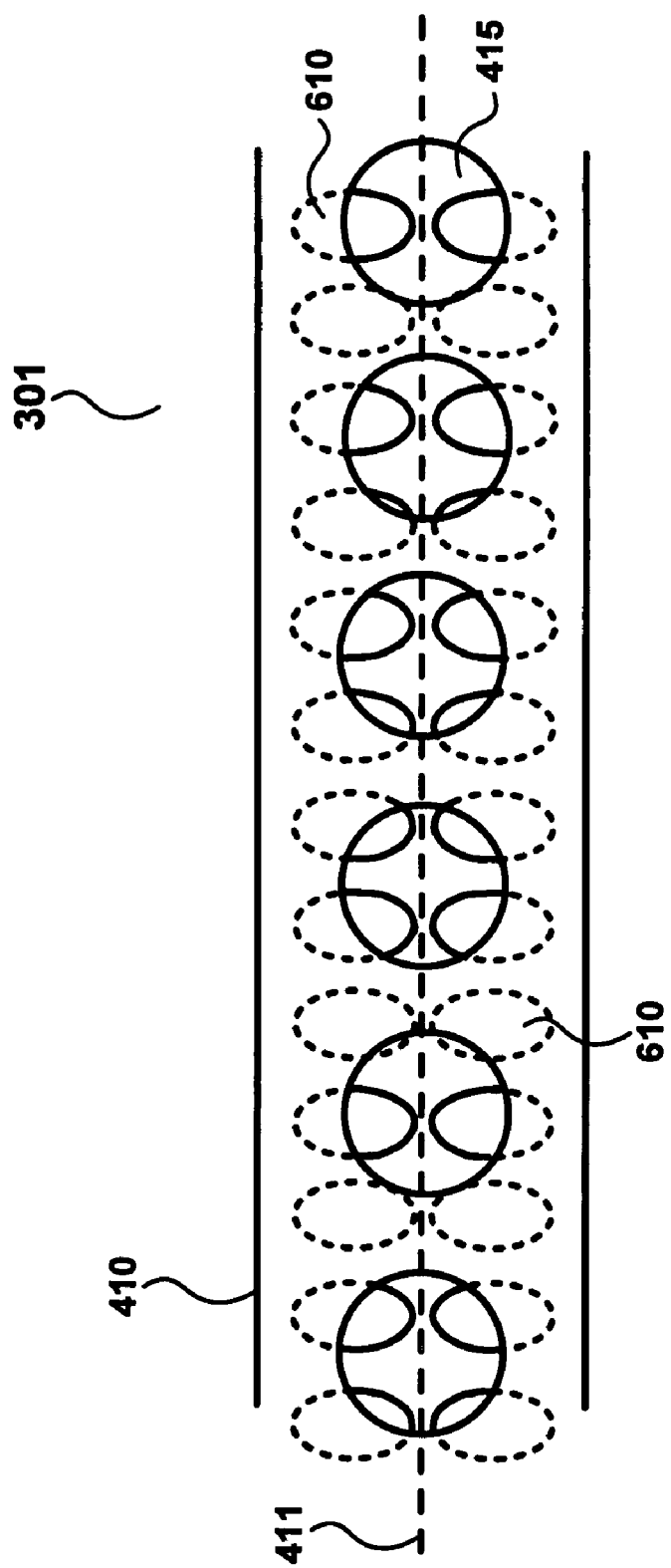
FIGS. 6A and 6B show a data storage medium in accordance with embodiments of the present invention.

FIG. 6A shows a data storage medium in accordance with embodiments of the present invention. In FIG. 6A, data track 410 is shown with a continuous pattern of metallized marks 610 disposed upon substrate 301. Also shown in FIG. 6A are features 415 which have been etched into the surface of substrate 301. As shown in FIG. 6A, after features 415 have been created in the e-beam resist (e.g., 302 of FIG. 3), portions of metallized marks 610 remain upon the surface of substrate 301. Some portions of metallized marks 610 underlie features 415 and will be etched away when features 415 are etched into substrate 301.

Figure 6B:
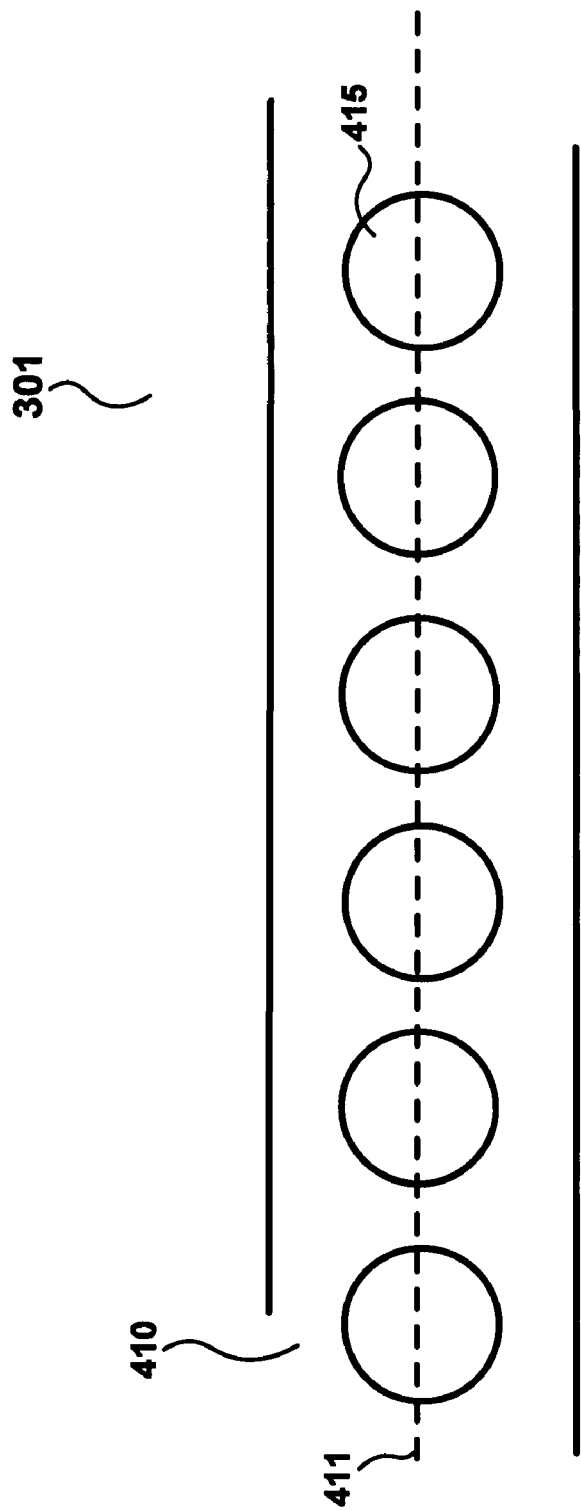

The remaining portions (e.g., represented with dashed lines in FIG. 6A) underlie e-beam resist 302 and will remain on substrate 301 after features 415 have been etched. In embodiments of the present invention, an additional etch process is performed when creating an optical data master disk in order to remove metallized marks 610 from the surface of substrate 301. In other words, after features 415 have been etched into substrate 301, the remaining e-beam resist 302 overlying substrate 301 is removed and a metal etch is performed to remove remaining portions of metallized marks 610. It is noted that other processes used in the art to remove a metal layer from a substrate can be used in embodiments of the present invention. After the metal etch process has been performed, substrate 301 is patterned as shown in FIG. 6B with metallized marks 610 gone from the surface of substrate 301. Thus, in embodiments of the present invention, no data space is lost due to the use of position error signal patterns such as marks 610.

Figure 7:
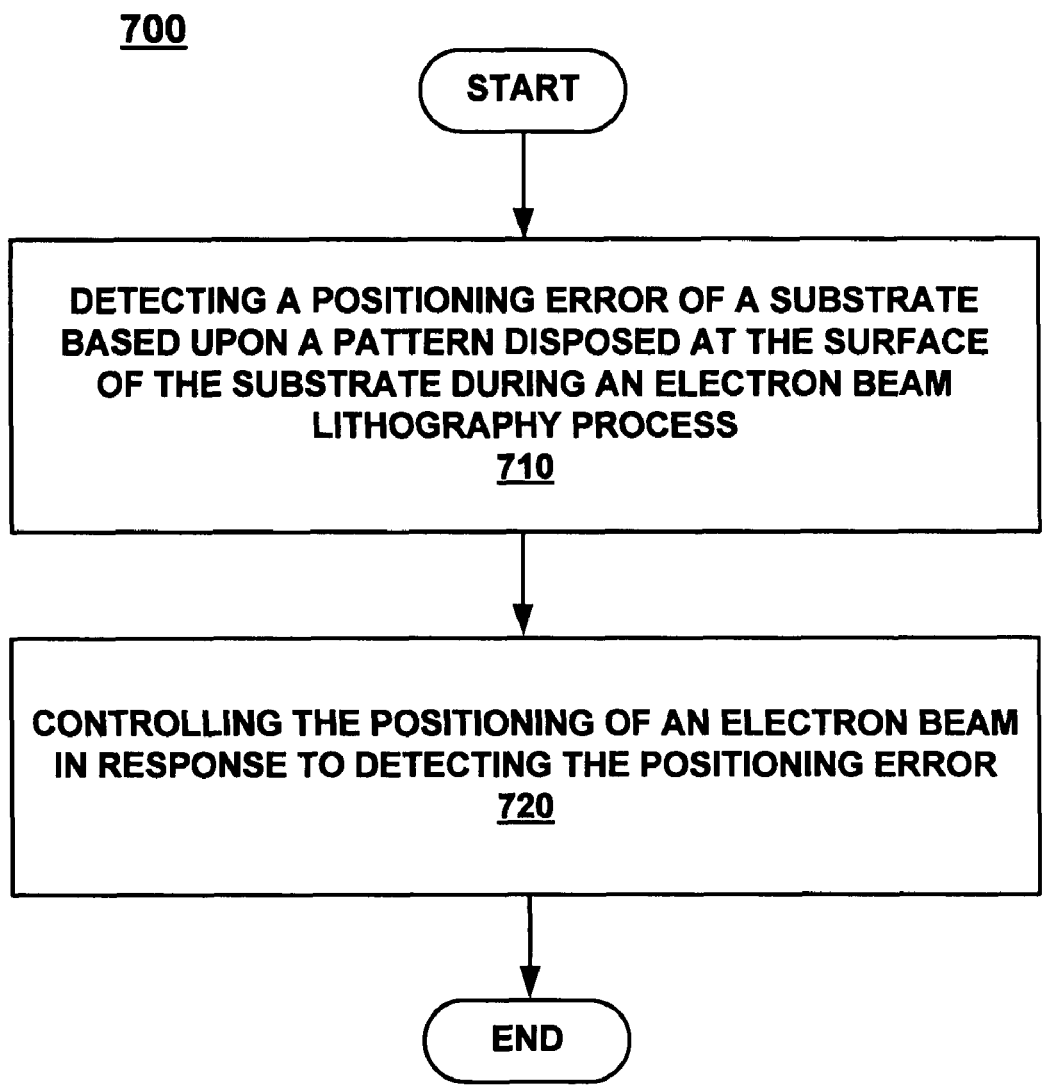
FIG. 7 is a flowchart of a method for fabricating a data storage medium in accordance with one embodiment of the present invention.

FIG. 7 is a flowchart of a method 700 for fabricating a data storage medium in accordance with one embodiment of the present invention. In operation 710 of FIG. 7, a positioning error of a substrate is detected based upon a pattern disposed at the surface of the substrate during an e-beam lithography process. As described above, marks 412a, 412b, 413a, and 413b can be used to derive a position error signal which indicates errors in the positioning of electron beam 311 with respect to a track centerline (e.g., 411 of FIG. 4B). Thus, embodiments of the present invention facilitate greater precision in the positioning of an electron beam during an e-beam lithography process than systems which only measure the relative position of the spindle or linear actuator supporting the substrate. Additionally, embodiments of the present invention can readily be coupled with existing e-beam lithography systems to improve the precision of positioning of the electron beam.

In operation 720 of FIG. 7, the positioning of an electron beam is controlled in response to detecting the positioning error. As described above, embodiments of the present invention use a closed loop servo control system to control the positioning of electron beam 311 in response to detecting a positioning error of substrate 301. More specifically, embodiments of the present invention can detect positioning errors on a track by track basis and can detect variations of the positioning of sub-portions of each track individually. In contrast, conventional e-beam lithography systems measure the positioning of the apparatus supporting the substrate and are unlikely to accurately detect variations in the positioning of tracks due to temperature, or variations in the positioning of the substrate with respect to the stage of the e-beam tool itself.

The foregoing descriptions of example embodiments have been presented for purposes of illustration and description. They are not intended to be exhaustive or to limit the teaching to the precise forms disclosed. Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for fabricating a data storage disk, said method comprising:
creating a detectable pattern at the surface of a data storage disk;
initiating a electron beam lithography process upon said data storage disk; and
using said detectable pattern to control the positioning of an electron beam relative to the surface of said data storage disk during said electron beam lithography process.

2. The method as recited in claim 1 further comprising:
selecting said data storage disk from the group consisting of an optical data master data storage disk and a magnetic data storage disk.

3. The method as recited in claim 1 wherein said detectable pattern comprises a servo control position error signal pattern and wherein controlling the positioning of said electron beam relative to the surface of said data storage disk further comprises:
detecting a position error signal through an overlying layer of resist material based upon the position of said detectable pattern; and
utilizing a control loop to control the positioning of said electron beam based upon said position error signal.

4. The method as recited in claim 3 wherein said detecting further comprises:
using an electron detector to detect a signal from said detectable pattern.

5. The method as recited in claim 1 wherein said creating said detectable pattern further comprises:
using a photolithography process to create said detectable pattern upon said data storage disk.

6. The method as recited in claim 5 wherein creating a detectable pattern further comprises:
adding a substrate to a surface of said data storage disk said substrate selected from the group consisting of a silicon substrate, a glass substrate, and a silicon dioxide substrate; and
creating a metallized pattern upon said substrate.

7. The method as recited in claim 6 further comprising:
removing said detectable pattern from said surface of said data storage disk.

8. The method as recited in claim 5 wherein creating a detectable pattern further comprises:
etching said detectable pattern into a metal substrate selectively deposited on said data storage disk.

9. A method for fabricating a data storage medium, said method comprising:
detecting a real-time positioning error based upon a pattern disposed on the surface of said data storage disk during an electron beam lithography process; and
controlling the positioning of an electron beam in response to said detecting of said positioning error.

10. The method as recited in claim 9 further comprising:
selecting said data storage disk from the group consisting of an optical data storage disk and a magnetic data storage disk.

11. The method as recited in claim 10 further comprising:
performing an electron beam lithography process upon said data storage disk.

12. The method as recited in claim 11 further comprising:
utilizing an electron detector to detect a signal based upon the position of said detectable pattern.

13. The method as recited in claim 12 wherein said detectable pattern comprises a servo control position error signal and wherein said method further comprises:
utilizing a closed loop servo control coupled with said electron detector to control said electron beam.

14. The method as recited in claim 11 further comprising:
adding a substrate to a surface of said data storage disk said substrate selected from the group consisting of a silicon substrate and a silicon dioxide substrate.

15. The method as recited in claim 14 further comprising:
using a photolithography process to create a metallized pattern upon a substrate selectively deposited on said data storage disk.

16. The method as recited in claim 15 further comprising:
removing said metallized pattern from said data storage disk when said electron beam lithography process has completed.

17. The method as recited in claim 10 further comprising:
etching said pattern into said magnetic data storage device; and
creating a raised area used to define data bits stored upon said data storage disk.

18. The method as recited in claim 9 further comprising:
detecting said pattern through an overlying layer of resist material.

19. An electron beam lithography apparatus comprising:
a data storage disk surface pattern detector; and
a control device coupled with said data storage disk surface pattern detector, said control device for generating a control signal; and
an electron beam positioning assembly coupled with said control device for controlling the positioning of an electron beam in response to said control signal.

20. The apparatus as recited in claim 19 wherein said control device comprises a closed loop servo control.

21. The apparatus as recited in claim 19 wherein said data storage disk surface pattern detector comprises an electron detection device.

22. The apparatus as recited in claim 19 wherein said data storage disk surface pattern detector detects a pattern disposed at the surface of said data storage disk through an overlying layer of resist material.

23. The apparatus as recited in claim 19 wherein said electron beam lithography apparatus comprises a rotary stage electron beam lithography apparatus.

24. The apparatus as recited in claim 19 wherein said control device generates said control signal in response to detecting a real-time positioning error based upon a pattern disposed on the surface of said data storage disk.

* * * * *